(12) United States Patent
Zhang et al.

(10) Patent No.: US 11,737,250 B2
(45) Date of Patent: Aug. 22, 2023

(54) POWER SUPPLY SYSTEM FOR SUPPLYING POWER TO NETWORK DEVICE

(71) Applicant: Delta Electronics (Shanghai) Co., Ltd., Shanghai (CN)

(72) Inventors: Jinfa Zhang, Shanghai (CN); Kai Dong, Shanghai (CN); Changyun Xiao, Shanghai (CN); Jinhao Gan, Shanghai (CN); Yong Huang, Shanghai (CN); Junlai Huang, Shanghai (CN); Zhongwei Ke, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 64 days.

(21) Appl. No.: 17/447,057

(22) Filed: Sep. 7, 2021

(65) Prior Publication Data
US 2022/0123660 A1 Apr. 21, 2022

(30) Foreign Application Priority Data
Oct. 20, 2020 (CN) .......................... 202011122732.X

(51) Int. Cl.
*H05K 7/20* (2006.01)
*H02M 1/32* (2007.01)
*H02M 3/00* (2006.01)

(52) U.S. Cl.
CPC ........ *H05K 7/20927* (2013.01); *H02M 3/003* (2021.05); *H02M 1/327* (2021.05)

(58) Field of Classification Search
CPC ...... H02M 1/327; H02M 3/003; H02M 7/003; H05K 7/20218; H05K 7/20236;
(Continued)

(56) References Cited

U.S. PATENT DOCUMENTS 9,414,520 B2 8/2016 Campbell et al.
11,329,570 B1 * 5/2022 Heo ...................... H02M 3/003
(Continued)

FOREIGN PATENT DOCUMENTS

| CN | 102508542 B | 11/2014 |
| CN | 109757060 A | 5/2019 |

OTHER PUBLICATIONS

J. W. Kolar et al., "PWM Converter Power Density Barriers," 2007 Power Conversion Conference—Nagoya, 2007, p. P-9-p. 29, doi: 10.1109/PCCON.2007.372914. (Year: 2007).*
(Continued)

*Primary Examiner* — Fred E Finch, III
(74) *Attorney, Agent, or Firm* — CKC & Partners Co., LLC

(57) ABSTRACT

The present application provides a power supply system for supplying power to network device, comprising power supply module, housing, and stereoscopic accommodating space therebetween. The power supply module without a fan comprises: a primary circuit comprising at least one primary switch and configured to receive AC input voltage and convert the AC input voltage into a first voltage; a transformer comprising primary and secondary windings and configured to convert the first voltage into a second voltage, the primary winding is coupled to the primary circuit; and a secondary circuit comprising at least one secondary switch and configured to convert the second voltage into a DC output voltage for the network device, the secondary circuit is coupled to the secondary winding, the secondary switch adopts SMT package, and power density of the power supply module is 60 W/inch$^3$ or more. The stereoscopic accommodating space is filled with liquid coolant for cooling.

17 Claims, 6 Drawing Sheets

(58) Field of Classification Search
CPC ........... H05K 7/20763; H05K 7/20772; H05K 7/2089; H05K 7/20927
See application file for complete search history.

(56) References Cited

U.S. PATENT DOCUMENTS

| | | | | |
|---|---|---|---|---|
| 2016/0294296 | A1* | 10/2016 | Lee | H02M 1/44 |
| 2019/0357384 | A1* | 11/2019 | Saito | H05K 7/20236 |
| 2021/0076540 | A1* | 3/2021 | Zhang | H02M 3/3376 |

OTHER PUBLICATIONS

L. Jian, Z. Jianhua, Y. Ruiguo, X. Bo, X. Guanghua and D. Qingan, "A Novel 50W/in3 and 96.2% efficient 48V/3.5kW single-phase rectifier," 2014 IEEE 36th International Telecommunications Energy Conference (INTELEC), 2014, pp. 1-4, doi: 10.1109/INTLEC.2014. 6972182. (Year: 2014).*

A. Y. Wen, B. L. Ruan, C. Z. Liu and D. J. Wang, "Simulation and performance analysis of fully-immersion evaporative cooling switching mode power supply," 2016 19th International Conference on Electrical Machines and Systems (ICEMS), 2016, pp. 1-5. (Year: 2016).*

E. Laloya, Ó. Lucía, H. Sarnago and J. M. Burdío, "Heat Management in Power Converters: From State of the Art to Future Ultrahigh Efficiency Systems," in IEEE Transactions on Power Electronics, vol. 31, No. 11, pp. 7896-7908, Nov. 2016, doi: 10.1109/TPEL. 2015.2513433. (Year: 2016).*

Y. Wen and L. Ruan, "Thermal simulation of fully-immersed evaporative cooling switching mode power supply," 2017 20th International Conference on Electrical Machines and Systems (ICEMS), 2017, pp. 1-5, doi: 10.1109/ICEMS.2017.8056193. (Year: 2017).*

M. Kasper and G. Deboy, "GaN HEMTs Enabling Ultra-Compact and Highly Efficient 3kW 12V Server Power Supplies," 2018 IEEE International Power Electronics and Application Conference and Exposition (PEAC), 2018, pp. 1-6, doi: 10.1109/PEAC.2018. 8590433. (Year: 2018).*

W. Liu, A. Yurek, Y. Chen, B. Sheng, X. Zhou and Y. -F. Liu, "A High Power Density Thermal Management Approach Using Multi-PCB Distributed Cooling (MPDC) Structure," 2019 IEEE Energy Conversion Congress and Exposition (ECCE), 2019, pp. 4181-4188, doi: 10.1109/ECCE.2019.8912257. (Year: 2019).*

M. J. Kasper, L. Peluso, G. Deboy, G. Knabben, T. Guillod and J. W. Kolar, "Ultra-high Power Density Server Supplies Employing GaN Power Semiconductors and PCB-Integrated Magnetics," CIPS 2020; 11th International Conference on Integrated Power Electronics Systems, Mar. 24-26, 2020, pp. 160-167. (Year: 2020).*

* cited by examiner

POWER SUPPLY SYSTEM FOR SUPPLYING POWER TO NETWORK DEVICE

CROSS-REFERENCE TO RELATED APPLICATIONS

This non-provisional application claims priority under 35 U.S.C. § 119(a) on Patent Application No. 202011122732.X filed in P.R. China on Oct. 20, 2020, the entire contents of which are hereby incorporated by reference.

Some references, if any, which may include patents, patent applications and various publications, may be cited and discussed in the description of this disclosure. The citation and/or discussion of such references, if any, is provided merely to clarify the description of the present disclosure and is not an admission that any such reference is "prior art" to the disclosure described herein. All references listed, cited and/or discussed in this specification are incorporated herein by reference in their entireties and to the same extent as if each reference was individually incorporated by reference.

FIELD

The application relates to a power supply system, and particularly to a power supply system for supplying power to a network device.

BACKGROUND

With development of distributed computing architecture such as artificial intelligence, cloud computing and big data, the amount of computation undertaken by data centers functioning as information infrastructure is increasing, the burden of energy consumption is also heavier, and how to deal with the balance between service needs and energy consumption becomes a problem to be urgently considered by operators and power suppliers. From the PUE values (overall equipment consumption/IT equipment consumption of the data centers), the PUE value of the data centers in China is usually in a range from 2.2 to 2.5. Since 2013, publication of several national policies sets higher requirements for energy saving level of the data centers, and the PUE value of new data centers at different places is substantially required less than 1.5, such that the traditional network power supply has too many problems when facing requirements for a larger power level and a higher power density, and in contrast, the power level and the power density of the data centers are increasing.

In the prior art, the power supply system in the data centers has a large influence on the power density. Generally, the power density is an index to measure how many power can be processed within a given space, and can be quantified as the amount of power processed per unit volume, and the unit of the power density is $W/m^3$ or $W/inch^3$. The value of the power density is calculated based on a rated power of a power converter and a volume (length×width×height) of the power supply system. In the traditional power supply system, passive components such as inductors, capacitors, transformers and radiators often occupy a fairly large part of the total volume, such that it is difficult to improve of the power density.

In order to improve or overcome the technical problem, based on the current power supply system, the exploration and research are made in switching frequency of the power converter and thermal performance of the system, but some other troubles are also occurred. For example, although increasing the switching frequency can improve the power density, a higher switching frequency brings side effects, such as increase in switching loss and rise in working temperature. Empirical law shows that when temperature is raised by 10° C., lifetime of the electronic device is reduced by half, and from reliability handbook, we can known that when the temperature is raised by 10° C., failure rates of the semiconductor and the capacitor are increased by about 25% and 50%, respectively.

In addition, although currently some design concept of heat dissipation using liquid cooled are proposed, there is no power supply module for supplying power to a network device specially designed based on such concept, or the power density is quite low, so current or future requirements for the power level and the power density of the data centers cannot be satisfied.

SUMMARY

One of the objects of the application is to provide a power supply system for supplying power to a network device.

According to one aspect of the present application, a power supply system for supplying power to a network device is provided, wherein the power supply system comprises:
  a housing;
  a power supply module without a fan, and comprising:
   a primary circuit comprising at least one primary switch and configured to receive an AC input voltage and convert the AC input voltage into a first voltage;
   a transformer comprising a primary winding and a secondary winding, and configured to convert the first voltage into a second voltage, wherein the primary winding is coupled to the primary circuit; and
   a secondary circuit comprising at least one secondary switch and configured to convert the second voltage into a DC output voltage and supply power to the network device, wherein the secondary is coupled to the secondary winding, the secondary switch adopts surface-mounted type (SMT) package, and a power density of the power supply module is greater than or equal to 60 $W/inch^3$;
  a stereoscopic accommodating space between the housing and the power supply module, wherein the stereoscopic accommodating space is filled with a liquid coolant for cooling the power supply module.

DETAILED DESCRIPTION

Figure 1:
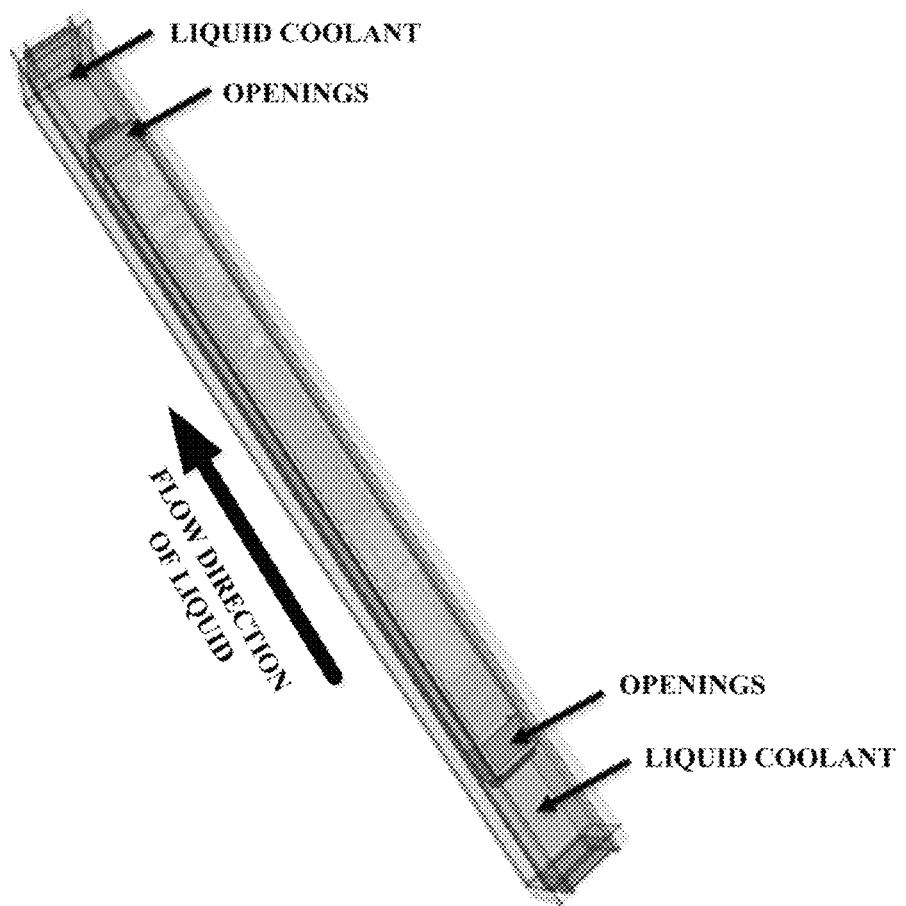
FIG. 1 illustrates a structural diagram of a power supply system for supplying power to a network device according to one embodiment of the application.

Now various embodiments of the application are described in details, and one or more examples of the embodiment are illustrated in the drawings. Hereinafter the same reference sign represents the same element in the explanations with reference to the drawings. Generally, only differences of the individual embodiment are explained. Various examples are provided to explain the application, instead of limiting the application. Further, as a part of one embodiment, features for explanation or description may be applied to or combined with other embodiments to obtain further embodiments, and the application aims to include these adjustments and changes.

With continuous improvement of energy conversion efficiency, the difficulty in designing a switching power supply is increased exponentially. For example, in some application scenarios, an improvement of conversion efficiency from 97% to 98% means reduction of loss by one third, while an improvement of the conversion efficiency from 98% to 99% means further reduction of loss by one half. As is speaking in a sense, in design of most circuit converters, reduction 50% of an overall loss may urge to redesign the circuit converter, and the only solution is to use more complex technology and more expensive component usually at the expense of dimensions. For example, a power supply of 1 kW only has a loss of 20.4 W when the conversion efficiency is 98%, and in order to realize 99% of the conversion efficiency, what is the expense for reducing a loss of 10.1 W? Relevant data shows that when industrial electricity price in the United States is 7 cents/kWh, assuming service life of power supply of 1 kW in normal operation is five years (or about 44,000 hours), reduction of the loss of 10.1 W may roughly save about 31 US dollars, but we also shall see that in order to improve the conversion efficiency from 98% to 99%, cost increased by the power supply exceeds 3100 US dollars. As can be known, if the design of the original power supply (having an efficiency of 98%) can still be reliably operated, saving of 31 US dollars is meaningless.

On the other hand, as for end users, production efficiency and profitability is more important. Although it seems a good thing to save several US dollars by consuming less energy, the profit obtained by increasing density of power supply device in a cabinet or rack and improving productivity per cubic foot is more attractive. In view of this, it is an important subject to be solved by the inventor to integrate more energy conversion devices into a smaller package, improve the power density while considering conversion efficiency, and efficiently utilize cabinet or rack space of the data center.

Figure 2:
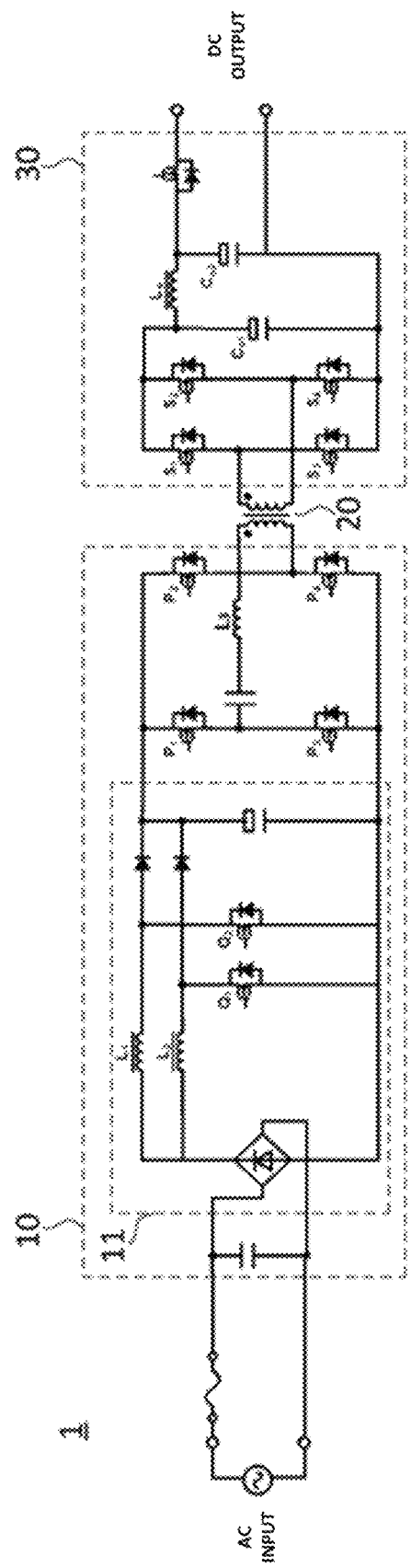
FIG. 2 illustrates a circuit diagram of a power supply module in the power supply system of FIG. 1.

FIG. 1 illustrates a structural diagram of a power supply system for supplying power to a network device according to one embodiment of the application. FIG. 2 illustrates a circuit diagram of a power supply module in the power supply system of FIG. 1.

Referring to FIG. 1 and FIG. 2, in this embodiment, the power supply system comprises a housing, a power supply module 1, and a stereoscopic accommodating space between the housing and the power supply module 1. Specifically, the power supply module 1 does not comprise a fan. The stereoscopic accommodating space is filled with a liquid coolant for cooling the power supply module 1. The power supply module 1 comprises a primary circuit 10, a transformer 20 and a secondary circuit 30. It shall be noted that liquid cooling refers to utilizing a specific liquid instead of air, such as, water, a fluorinated liquid or one special non-conductive oil to bring away heat generated by various components of the power supply module 1 during operation. According to whether the liquid is in contact with a heating device, liquid cooling can be roughly divided into two types. One is indirect cooling plate, i.e., the device is not in direct contact with the liquid, but the device transmits the heat to cooling fins filled with the liquid, and then cooling fins bring the heat out of the device through liquid circulation. Since the cooling fins can only cover a part of heating elements, and heat generated by other elements still needs to be brought out by a fan, so the fan occupies a part of region in a layout space of the power supply system, resulting in a reduction in power density. The other is direct immersion, i.e., the device, even the entire power supply system is directly immersed in the liquid, and the heat is brought out through liquid circulation without a fan in the apparatus. Architecture of the power supply system in the present application is mainly designed for the direct immersion.

Specifically, the primary circuit 10 is configured to receive an AC input voltage and convert the AC input voltage into a first voltage, and the primary circuit 10 comprises at least one primary switch, such as, P1. The transformer 20 comprises a primary winding and a secondary winding, and the transformer 20 is configured to convert the first voltage into a second voltage, wherein the primary winding is coupled to the primary circuit 10. The secondary circuit 30 is coupled to the secondary winding and configured to convert the second voltage into a DC output voltage and supply power to the network device. The secondary circuit 30 comprises at least one secondary switch, such as, S1. The secondary switch adopts surface-mounted type (SMT) package, and a power density of the power supply module 1 is greater than or equal to 60 W/inch$^3$. In design of the power supply system, it shall be ensured that the actual thermal power of all semiconductor elements in the circuit should be less than respective heat dissipating thresholds. For example, if the heat dissipating threshold of a rectifier bridge is 15 W, when the actual thermal power of the rectifier bridge exceeds 15 W, the amount of heat of the rectifier bridge has exceeded thermal design, so the rectifier bridge has a risk of being damaged. For another example, when the switch adopts SMT package of PG-HSOF-8, the heat dissipating threshold in immersion liquid cooling may reach 10 W, but the heat dissipating threshold in air cooling is only 5 W. Preferably, the primary circuit 10 and the secondary circuit 30 both may be configured as modularized circuits, and flexible expansion and good compatibility are realized when the modularized circuits adopt a cascaded or parallel manner. The primary switch P1 and/or the secondary switch S1 are silicon switches, silicon carbide switches or gallium nitride switches made of Si, SiC or GaN material.

In one specific embodiment, the primary circuit 10 further comprises a power factor correction (PFC) circuit and an inverter circuit. The DC side of the inverter circuit is electrically coupled to the PFC circuit, and the AC side of the inverter circuit is electrically coupled to the primary winding of the transformer 20. The inverter circuit comprises a plurality of switches adopting SMT package.

For example, the PFC circuit can be a bridge circuit, and the bridge PFC circuit comprises a rectifier circuit, a PFC inductor, a switch unit and a diode unit. Here the rectifier circuit may comprise a single rectifier bridge or a plurality of rectifier bridges connected in parallel, and the PFC inductor is electrically coupled to the rectifier circuit. The switch unit is electrically coupled to the PFC inductor. The diode unit is electrically coupled to the PFC inductor and comprises a single diode or a plurality of diodes connected in parallel. Preferably, the switch unit and the diode unit are power semiconductor elements adopting SMT package.

For another example, the PFC circuit also can be none-bridge PFC circuit, and the none-bridge PFC circuit comprises a PFC inductor, a switch unit and a diode unit. The PFC inductor is electrically coupled to the switch unit, and the diode unit is electrically coupled to the PFC inductor and comprises a single diode or a plurality of diodes connected in parallel. Similarly, the switch unit and the diode unit are power semiconductor elements adopting SMT package. Those skilled in the art shall understand that the PFC circuit 11 in FIG. 2 adopts a Boost structure, but the present application is not limited thereto. For example, the PFC circuit 11 also can adopt other circuit structures such as, Totem Pole, H-bridge, and the like. Preferably, regardless of the PFC bridge circuit or the none-bridge PFC circuit, a wire-diameter current density of windings of the PFC inductor may be greater than or equal to 15 A/mm². Therefore, on the premise that temperature rising of the PFC inductor satisfies the requirement, using wires with smaller wire diameter to form the inductor winding of the PFC inductor may further compress winding space, reduce volume dimension of the PFC inductor, and save occupied volume in the layout space of the power supply module 1. Relevant tests show that, compared with the wire-diameter current density of windings of the PFC inductor in air cooling, the wire-diameter current density of windings of the PFC inductor in immersion liquid cooling is at least enhanced by 50%, so in the case that the power supply system of the present application adopts the immersion liquid cooling, the volume of the PFC inductor is remarkably reduced.

Further, the housing further comprises a plurality of openings hollowed with preset patterns. When the power supply system of the present application is normally operated, a liquid coolant between the power supply module 1 and the housing flows from one end (such as, a power input side) of the system to the other end (such as, a power output side), and the heating elements in the system are cooled via the liquid coolant. In order to increase reliability of heat dissipation and operational security of the power supply, openings hollowed with preset patterns can be provided at specific positions of the housing. For example, through holes are disposed on a housing surface close to the power input side, and through holes are also disposed on the housing surface close to the power output side, such that a flow path can be ensured to be smoother, and elements or structures at the power input side and elements or structures at the power output side can be avoided from blocking the flow path of the liquid coolant. In this embodiment, the liquid coolant can be a fluorinated liquid or an oily liquid.

In one specific embodiment, the secondary circuit further comprises a rectifier circuit. The rectifier circuit is electrically coupled to the secondary winding of the transformer. The rectifier circuit comprises a plurality of switch units, each of the switch units comprises a single switch or a plurality of switches connected in parallel, and the rectifier switches adopt SMT package. Accordingly, in this embodiment, the power supply module 1 adopts a circuit topology of PFC+DC/DC, wherein the inverter circuit, the transformer and the rectifier circuit form a DC/DC module. In other words, the inverter circuit converts a DC voltage outputted by the PFC circuit into an AC voltage, then energy is delivered from a primary side to a secondary side via magnetic coupling of the primary winding and the secondary winding of the transformer, and the rectifier circuit converts the AC voltage into a DC voltage. Those skilled in the art shall understand that the DC/DC module in FIG. 2 adopts LLC resonant circuit, but the present application is not limited thereto. The DC/DC module also can adopt other circuit structures such as phase-shifted full-bridge, double active bridge, and the like. Moreover, in order to prevent energy from being delivered reversely from the output side to the input side, the secondary circuit further may further comprise an anti-backflow circuit (or referred to as an ORing circuit) having a plurality of switches connected in parallel. For example, the switches can be diodes or MOSFETs. Similarly, the switches in the anti-backflow circuit may preferably adopt SMT package, and the occupied layout space is saved by adopting SMT package. As a substitutable schematic embodiment, in immersion liquid cooling, the number of switches of the anti-backflow circuit also may be reduced by approximately half as compared to air cooling with the same power level.

Figure 3:
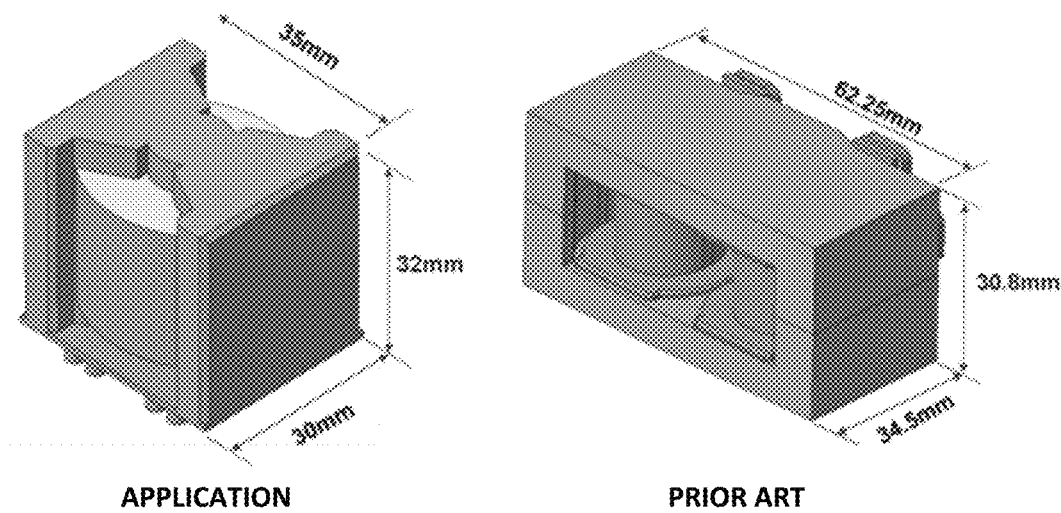
FIG. 3 illustrates a stereoscopic structure diagram of a transformer of the power supply module in one schematic embodiment of the power supply system of FIG. 1.

FIG. 3 illustrates a stereoscopic structure diagram of a transformer of the power supply module in one schematic embodiment of the power supply system of FIG. 1.

As stated previously, the windings of the PFC inductors $L_1$ and $L_2$ using wires with smaller wire diameter (e.g., a wire-diameter current density is greater than or equal to 15 A/mm²) may further compress a winding space, reduce a volume dimension of the PFC inductors, and save an occupied volume in the layout space of the power supply module. Similarly, the primary winding and the secondary winding of the transformer of the power supply module in the present application can be formed by using wires with smaller wire diameter, which can reduce a volume of the winding. Correspondingly, due to reduction of the volume of the windings of the transformer, fewer magnetic cores can be used to further reduce an occupied volume of the magnetic cores. For example, for the power supply system with the power level of 2 kW for supplying power to a network device, in the case of current heat dissipation, the power supply module often needs a transformer having two magnetic cores, and a volume dimension of the transformer is 62.25 mm×34.5 mm×30.8 mm. However, when the power supply module of the present application uses the transformer with the above wire-diameter current density, the power supply module only needs a transformer having a single magnetic core, and the volume dimension of the transformer is reduced to 35 mm×30 mm×32 mm, thereby improving an occupied ratio (saving about 49.2%) of the transformer in the layout space of the power supply module, and improving the power density of the power supply system.

Figure 4:
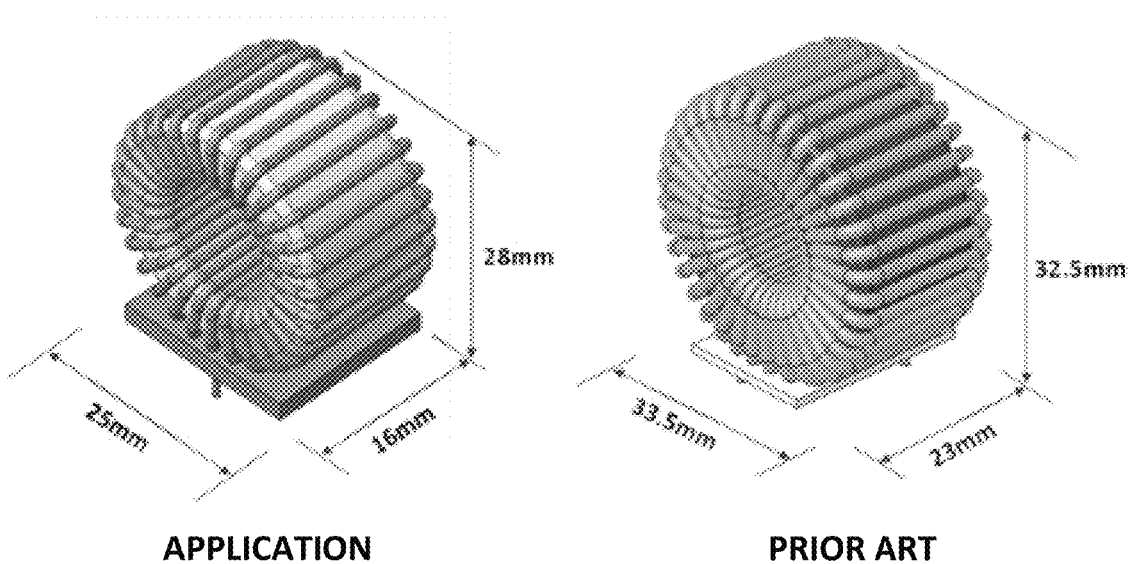
FIG. 4 illustrates a stereoscopic structure diagram of a PFC inductor of the power supply module in one schematic embodiment of the power supply system of FIG. 1.

FIG. 4 illustrates a stereoscopic structure diagram of a PFC inductor of the power supply module in one schematic embodiment of the power supply system of FIG. 1.

Referring to FIG. 4, in the power supply system of FIG. 1, when the wire-diameter current density of the windings of the PFC inductor in the power supply module is greater than or equal to 15 A/mm², the volume dimension of the PFC inductor is 25 mm×16 mm×28 mm. In contrast, the volume dimension of the current PFC inductor is 33.5 mm×23 mm×32.5 mm. As can be known, the PFC inductor of the present application is reduced in dimensions of length, width and height, thereby reducing the occupied volume in the layout space of the power supply module.

Figure 5:
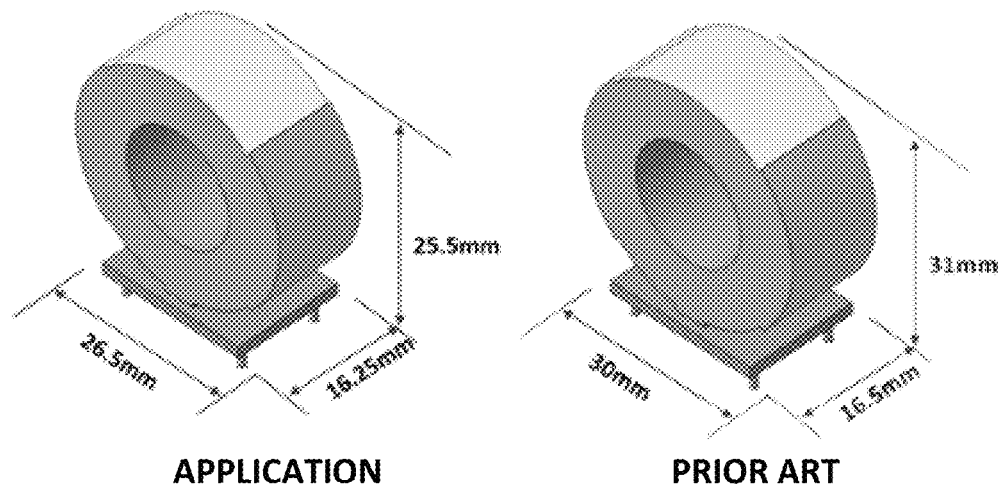
FIG. 5 illustrates a stereoscopic structure diagram of a common mode inductor of the power supply module in one schematic embodiment of the power supply system of FIG. 1.

FIG. 5 illustrates a stereoscopic structure diagram of a common mode inductor of the power supply module in one schematic embodiment of the power supply system of FIG. 1.

Referring to FIG. 5, in the power supply system of FIG. 1, the primary circuit of the power supply module may further comprise an EMI filter circuit, the EMI filter circuit comprises a common mode inductor, and a wire-diameter current density of windings of the common mode inductor is greater than or equal to 15 A/mm$^2$. A volume dimension of the common mode inductor is 26.5 mm×16.25 mm×25.5 mm, and in contrast, the volume dimension of the current common mode inductor is 30 mm×16.5 mm×31 mm. As can be known, the common mode inductor of the present application is remarkably reduced in dimensions of length and height, thereby reducing the occupied volume in the layout space of the power supply module.

Figure 6:
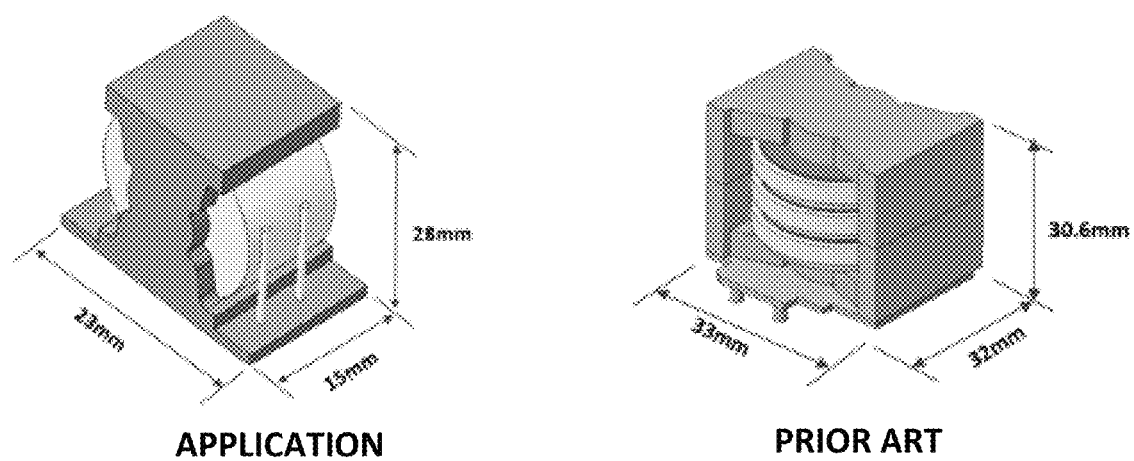
FIG. 6 illustrates a stereoscopic structure diagram of a resonant inductor of the power supply module in one schematic embodiment of the power supply system of FIG. 1.

FIG. 6 illustrates a stereoscopic structure diagram of a resonant inductor of the power supply module in one schematic embodiment of the power supply system of FIG. 1.

Referring to FIG. 6, in the power supply system of FIG. 1, the primary circuit of the power supply module may further comprise a resonant inductor $L_3$. Preferably, a wire-diameter current density of windings of the resonant inductor may be greater than or equal to 15 A/mm$^2$. A volume dimension of the resonant mode inductor is 23 mm×15 mm×28 mm. In contrast, the volume dimension of the current resonant inductor is 33 mm×32 mm×30.6 mm. As can be known, the resonant inductor of the present application is remarkably reduced in dimensions of length, width and height, and the occupied volume in the layout space of the power supply module is reduced by 70%.

Figure 7:
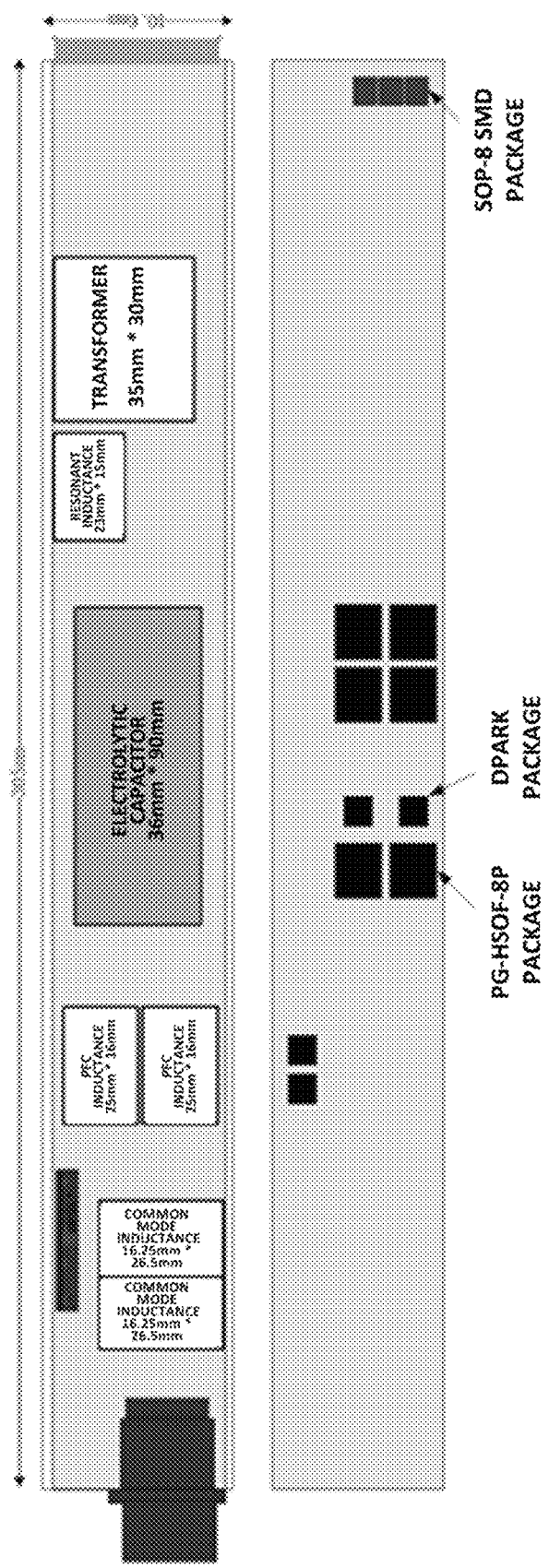
FIG. 7 illustrates a stereoscopic dimensions diagram of a PCB circuit board of the power supply module in one schematic embodiment of the power supply system of FIG. 1.

FIG. 7 illustrates a stereoscopic dimensions diagram of a Printed Circuit Board (PCB) of the power supply module in one schematic embodiment of the power supply system of FIG. 1.

Referring to FIG. 7, FIG. 1 and FIG. 2, in this schematic embodiment, the power level of the power supply module of the present application is 2 kW, and wire-diameter current densities of the windings of the PFC inductor, the common mode inductor, the resonant inductor and the transformer are greater than or equal to 15 A/mm$^2$. A dimension of the corresponding PCB is 305 mm in length, 40.6 mm in width, and 40.6 mm in height. Here, one inch is equal to 25.4 mm, and according to computational formula of the power density, the power density of the power supply module is 2000×25.4×25.4×25.4/(305×40.6×40.6) W/inch$^3$, i.e., 65.2 W/inch$^3$. Those skilled in the art shall understand that the power level and the volume dimension of the power supply module of FIG. 7 are only descriptive examples, but the application is not limited thereto. In some other embodiments, when electronic components used in the power supply module satisfy the specification and are normally operated, value of the power density of the power supply module also may be further improved. For example, if the power level of the power supply module is improved from 2 kW to 4 kW, the power density of the power supply module is correspondingly improved to 130.4 W/inch$^3$. For another example, by keeping the power level of the power supply module unchanged and adjusting layout positions of the electronic components on the PCB, the volume dimension of the PCB can be further reduced and the value of the power density of the power supply module can be continuously improved.

Figure 8:
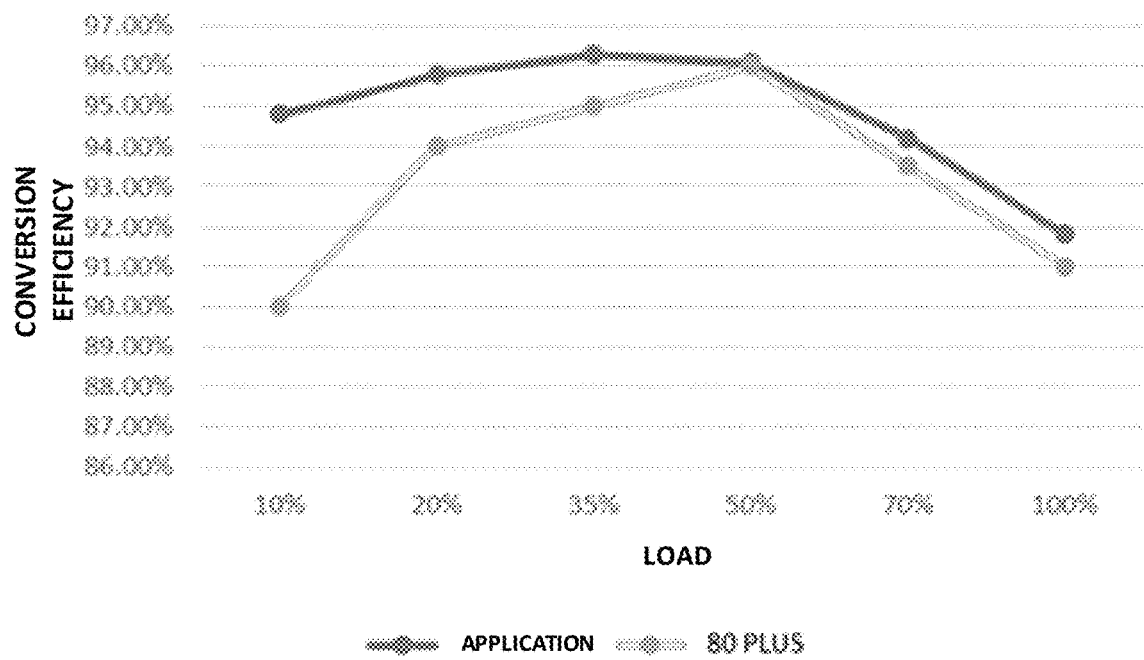
FIG. 8 illustrates a schematic diagram of a curve of conversion efficiency of the power supply module in one schematic embodiment of the power supply system of FIG. 1.

FIG. 8 illustrates a schematic diagram of a curve of conversion efficiency of the power supply module in one schematic embodiment of the power supply system of FIG. 1.

Referring to FIG. 8, in this embodiment, conversion efficiency of the power supply module of the present application is increased monotonically, and then decreased monotonically within a range from 0% to 50% of a rated load. Preferably, the optimal conversion efficiency of the power supply module corresponds to a working state of the rated load within a range from 10% to 40%, thereby improving light load efficiency of the power supply system, and reducing cost. More preferably, the peak conversion efficiency of the power supply module corresponds to a working state of the rated load at 35%.

Loss of the power supply module can be roughly divided into three categories, which are associated with zero power, first power and second power of the current, i.e., $I^0$, $I^1$ and $I^2$. Hereinafter explanations are made briefly.

$I^0$ loss mainly comprises magnetic core loss, controlling loss and driving loss, and mainly affects the conversion efficiency within a working range from 10% to 35% of the rated load. Such loss is a loss to be reduced significantly, in particular, the magnetic core loss, in optimizing the efficiency curve. In the case that the dimension of the power supply is limited, the magnetic core loss of the transformer and the inductor is reduced by increasing the number of turns of the windings, or increasing the volume of the magnetic cores while reducing the wire diameter. Moreover, in the case of light load, the current is small, and winding copper loss has much less influence on power conversion efficiency than magnetic core loss.

$I^1$ loss mainly comprises rectifier loss and switching loss of the switches, and mainly affects the conversion efficiency within a working range from 35% to 70% of the rated load. Taking the switching loss of the switches as an example, since the switching loss is proportional to a switching frequency, in the case of light load, the switching loss is much greater than turn-on loss, and the switches with larger resistance but faster switching speed can be selected, which can reduce the $I^1$ loss in light load and the cost of the switches. If the selected circuit topology is designed to realize soft switching of the switches, the reduction of the switching loss is better for improving half load efficiency, which can satisfy the requirement of 80Plus® for the conversion efficiency of the power supply.

$I^2$ loss mainly comprises turn-on loss of the switches, winding copper loss of the transformer and the inductor, capacitor loss and wire loss, and mainly affects the conversion efficiency within a working range from 70% to 100% of the rated load. Selecting the switches with larger resistance, reducing the number of switches in parallel connection, and increasing the wire-diameter current density will make the $I^2$ loss increased, but can greatly reduce design cost and volume of the power supply.

As can be known, when the power density of the power supply module of the present application at least reaches 60 W/inch$^3$, the conversion efficiency of the power supply can be optimized in combination with specific application scenarios of the network power supply, and adjust a load point with the optimum efficiency of the power supply module to a range of light load by sacrificing a part of heavy load efficiency. On one hand, the advantage of liquid cooling is fully used to reduce the difficulty in design of the power supply, in particular, thermal design, and on the other hand, cost is saved and electricity operating cost of the system is reduced when focusing on the specific application scenario of supplying power to the network device. Specifically, the present application reduces the $I^0$ loss by using magnetic elements (such as, the PFC inductor, the common mode inductor, the resonant inductor or the primary and secondary windings of the transformer) with larger wire-diameter current densities. Meanwhile, the $I^0$ loss is reduced by using the semiconductor devices adopting SMT package and reducing the number of devices. Further, although the $I^2$ loss is increased by selecting the switches with larger resistance and reducing the number of switches, design cost and volume of the power supply can be remarkably reduced, and influence on the conversion efficiency in light load is small. Therefore, the optimal conversion efficiency of the power supply module of the present application may correspond to a working state of the rated load within a range from 10% to 40%, and in a working state of the rated load at 50%, the conversion efficiency of the power supply module is still higher than the requirement of 80Plus®.

Figure 9:
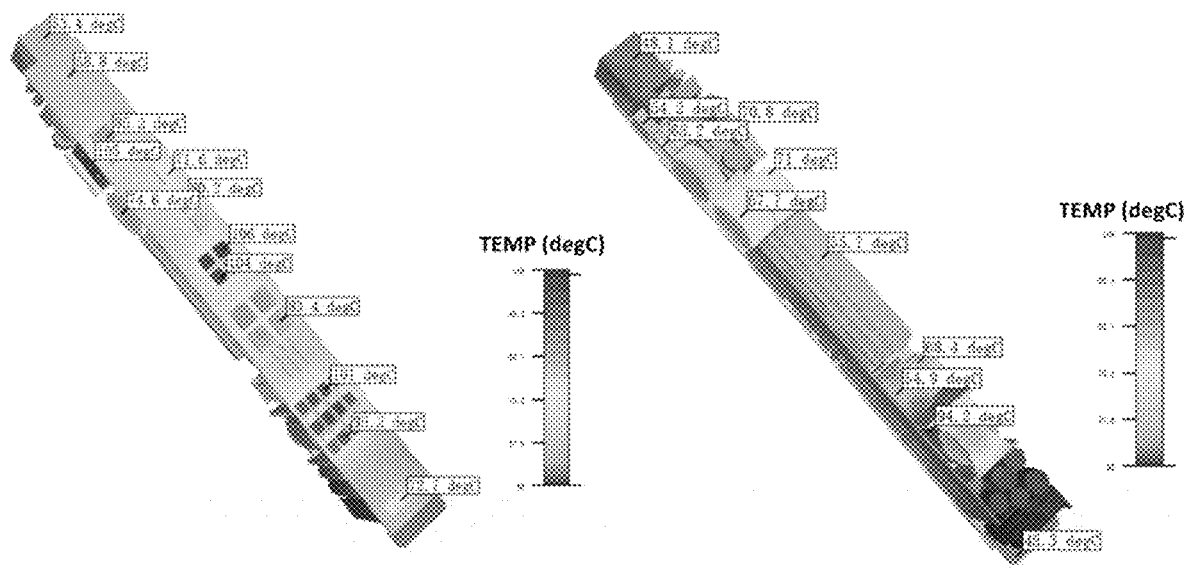
FIG. 9 illustrates thermal simulation result of critical regions when the system is operated in the power supply system of FIG. 1.

FIG. 9 illustrates thermal simulation result of critical regions when the system is operated in the power supply system of FIG. 1. As shown in FIG. 9, after the power supply module of the present application is modeled, from thermal simulation data on front and back of the PCB, temperatures of the respective components satisfy the requirement for IPC9592 derating.

The application provides a power supply system for supplying power to a network device, and the power supply system comprises a power supply module, a housing, and a stereoscopic accommodating space between the housing and the power supply module. The power supply module without a fan comprises a primary circuit, a transformer and a secondary circuit. The primary circuit comprises at least one primary switch and is configured to receive an AC input voltage and convert the AC input voltage into a first voltage. The transformer comprises a primary winding and a secondary winding and is configured to convert the first voltage into a second voltage, wherein the primary winding is coupled to the primary circuit. The secondary circuit comprises at least one secondary switch and is configured to convert the second voltage into a DC output voltage and supply power to the network device, wherein the secondary circuit is coupled to the secondary winding, the secondary switch adopts SMT package, and a power density of the power supply module is greater than or equal to 60 W/inch³. The stereoscopic accommodating space is filled with a liquid coolant for liquid cooling of the power supply module. As compared to the prior art, the power supply module of the application adopts a power architecture of an AC/DC converter, and the secondary switch in the secondary circuit is designed as SMT package, and a liquid coolant is filled between the power supply module and the housing, such that a power density of the power supply module is greater than or equal to 60 W/inch³. In addition, the power supply module of the application designs the optimal conversion efficiency within a range of light load, while ensuring that temperature of components in the power supply also satisfies the requirement for derating in the case of full load.

Although specific examples of the application are disclosed in the foregoing embodiments, the application is not limited thereto, and those skilled in the art shall make various changes and modifications without departing from principle and spirit of the application, so the protection scope of the application shall be subjected to the scope defined by the appended claims.

What is claimed is:

1. A power supply system for supplying power to a device, comprising:
   a housing;
   a power supply module without a fan, comprising:
      a primary circuit comprising at least one primary switch and configured to receive an AC input voltage and convert the AC input voltage into a first voltage;
      a transformer comprising a primary winding and a secondary winding, and configured to convert the first voltage into a second voltage, wherein the primary winding is coupled to the primary circuit; and
      a secondary circuit comprising at least one secondary switch and configured to convert the second voltage into a DC output voltage and supply power to the network device, wherein the secondary circuit is coupled to the secondary winding, the secondary switch adopts surface-mounted type (SMT) package, and a power density of the power supply module is greater than or equal to 60 W/inch³; and
   a accommodating space between the housing and the power supply module, wherein the accommodating space is filled with a liquid coolant for cooling the power supply module,
   wherein respective wire-diameter current densities of the primary winding and the second winding are greater than or equal to 15 A/mm².

2. The power supply system according to claim 1, wherein the primary switch adopts SMT package.

3. The power supply system according to claim 1, wherein the housing comprises a plurality of openings hollowed with preset patterns.

4. The power supply system according to claim 1, wherein the primary circuit further comprises an EMI filter circuit having a common mode inductor, and a wire-diameter current density of windings of the common mode inductor is greater than or equal to 15 A/mm².

5. The power supply system according to claim 1, wherein the primary circuit further comprises a bridge PFC circuit having a rectifier circuit, a PFC inductor, a switch unit and a diode unit,
   wherein the rectifier circuit comprises a single rectifier bridge or a plurality of rectifier bridges connected in parallel, the PFC inductor is electrically coupled to the rectifier circuit, the switch unit is electrically coupled to the PFC inductor, and the diode unit is electrically coupled to the PFC inductor and comprises a single diode or a plurality of diodes connected in parallel.

6. The power supply system according to claim 5, wherein a wire-diameter current density of windings of the PFC inductor is greater than or equal to 15 A/mm².

7. The power supply system according to claim 5, wherein the switch unit and the diode unit are power semiconductor elements adopting SMT package.

8. The power supply system according to claim 5, wherein the primary circuit further comprises an inverter circuit having a DC side electrically coupled to the bridge PFC circuit and an AC side electrically coupled to the primary winding of the transformer, and the inverter circuit comprises a plurality of switches adopting SMT package.

9. The power supply system according to claim 1, wherein the primary switch is made of Si, SiC or GaN material.

10. The power supply system according to claim 1, wherein the secondary switch is made of Si, SiC or GaN material.

11. The power supply system according to claim 1, wherein the secondary circuit further comprises a rectifier circuit electrically coupled to the secondary winding of the transformer and comprising a plurality of switch units, wherein each of the switch units comprises a single switch or a plurality of switches connected in parallel and each of the switches adopts SMT package.

12. The power supply system according to claim 1, wherein the secondary circuit further comprises an anti-backflow circuit and the anti-backflow comprises a plurality of switches connected in parallel.

13. The power supply system according to claim 1, wherein conversion efficiency of the power supply module is increased monotonically and then decreased monotonically within a range from 0 to 50% of a rated load.

14. The power supply system according to claim 13, wherein the optimal conversion efficiency of the power supply module corresponds to a working state within a range from 10% to 40% of the rated load.

15. The power supply system according to claim 14, wherein the peak conversion efficiency of the power supply module corresponds to a working state of the rated load at 35%.

16. The power supply system according to claim 13, wherein in a working state of the rated load at 50%, the conversion efficiency of the power supply module is higher than the standard of 80Plus®.

17. The power supply system according to claim 1, wherein the liquid coolant is fluorinated liquid or oily liquid.

* * * * *